United States Patent [19]
Davis

[11] 3,961,292
[45] June 1, 1976

[54] RADIO FREQUENCY TRANSFORMER

[76] Inventor: Ross Alan Davis, 724 Ala Moana Blvd., Honolulu, Hawaii 96813

[22] Filed: May 19, 1975

[21] Appl. No.: 578,642

Related U.S. Application Data

[63] Continuation of Ser. No. 430,095, Jan. 2, 1974, abandoned.

[52] U.S. Cl. .................................... 333/32; 336/84; 336/174; 336/195; 336/229; 343/712
[51] Int. Cl.² ..................... H03H 7/38; H01Q 1/32
[58] Field of Search .......... 343/712, 859, 860, 865; 333/24 R, 32; 325/376, 381, 385; 336/84, 174, 175, 195, 229

[56] References Cited
UNITED STATES PATENTS

| | | | |
|---|---|---|---|
| 1,160,960 | 11/1915 | Thordarson | 336/195 X |
| 2,376,101 | 5/1945 | Tyzzer | 174/36 |
| 3,005,965 | 10/1961 | Wertanen | 336/195 X |
| 3,197,723 | 7/1965 | Dortort | 336/195 |
| 3,614,694 | 10/1971 | Koontz | 336/195 X |
| 3,717,808 | 2/1973 | Horna | 336/195 |
| 3,717,876 | 2/1973 | Volkers et al. | 343/712 |

FOREIGN PATENTS OR APPLICATIONS

| | | | |
|---|---|---|---|
| 308,406 | 3/1929 | United Kingdom | 336/174 |

Primary Examiner—Paul L. Gensler

[57] ABSTRACT

An improved radio-frequency transformer, particularly useful in conductive-body antenna systems, is provided in which telescoping of two or more portions of the primary of the transformer results in increased compactness, high effeciency and decreased cost.

7 Claims, 1 Drawing Figure

RADIO FREQUENCY TRANSFORMER

This is a continuation of application Ser. No. 430,095 filed Jan. 2, 1974, and now abandoned.

RELEVANT COPENDING APPLICATIONS

Application Ser. No. 427,258 filed Dec. 21, 1973, and now abandoned by this inventor and entitled Antenna System Utilizing Currents in Conductive Body. Application Ser. No. 427,259 filed Dec. 21, 1973 now U.S. Pat. No. 3,916,413 by this inventor and entitled Remotely Tuned Conductive-Body Antenna System. A-M radio

BACKGROUND OF THE INVENTION

1. Field of the Invention

This invention relates to radio-frequency transformers and more particularly to such transformers adapted for use in coupling low-impedance conductive-body antennas to associated radio-frequency apparatus.

2. Description of the Prior Art

In U.S. Pat. Nos. 2,923,813; 2,971,191; 3,007,164 and 3,066,293 and in the applications referred to herein under the heading RELEVANT COPENDING APPLICATIONS this inventor described several approaches to utilizing as antennas conductive structures, such as automobile bodies. One of the major problems in coupling R. F. energy into or out of such conductive-body antennas is the extremely low impedance looking into the conductive body at the discontinuity into which or from which R. F. energy is to be introduced or extracted from the conductive body. This problem is a particularly acute one at the radio frequencies associated with the medium wave A-M radio broadcast band (approximately 550 to 1600 kiloherz).

To help solve this problem this inventor conceived, reduced to practise and has described in his prior patents and applications a voltage and impedance transformer usable at radio frequencies which comprised a one-turn conductive sheath or tube acting as a primary, the secondary being formed by a conductor passing through the inner opening of the sheath or tube 8 or 9 times (when used at medium wave frequencies) and, hence, being very tightly coupled, magnetically, to the singleturn primary of the transformer. This design reduces unwanted electrostatic signals and noise in the transformation process. To further increase the coupling between the single turn primary and its secondary and to increase the inductance of the single turn primary to a level such that it matches the inductance of the conductive-body as it appears at the discontinuity in the conductive body a series of ferrite, high-permeability beads is applied so that it covers completely the one-turn primary sheath or tubing.

SUMMARY OF THE INVENTION

Briefly stated, the present invention provides a radio-frequency transformer adapted for coupling a low-impedance antenna to conventional radio apparatus with the primary of the transformer being divided into at least two telescoping hollow sections through which the secondary winding or windings pass and around which ferrite, high permeability beads may be placed for overall minimum size to effect the desired efficient coupling of energy between the unusually low-impedance antenna terminals and the associated radio frequency apparatus. A third telescoping, hollow sheath or tube, which is grounded, may be interposed between the primary portion or portions and the secondary portion or portions of the transformer to reduce electrostatic noise coupling there between.

It is an object of this invention to provide an improved transformer for coupling a very low impedance antenna to conventional radio apparatus.

It is an additional object of this invention to provide a transformer with maximum electrostatic noise suppression for coupling a conductive-body antenna to radio apparatus.

It is a further object of this invention to provide a transformer of minimum size and maximum efficiency for coupling a conductive-body antenna to radio apparatus.

It is a still further object of this invention to provide a transformer of minimum size, complexity and cost for coupling a very low impedance antenna to conventional radio apparatus.

BRIEF DESCRIPTION OF THE PREFERRED EMBODIMENT

Figure 1:
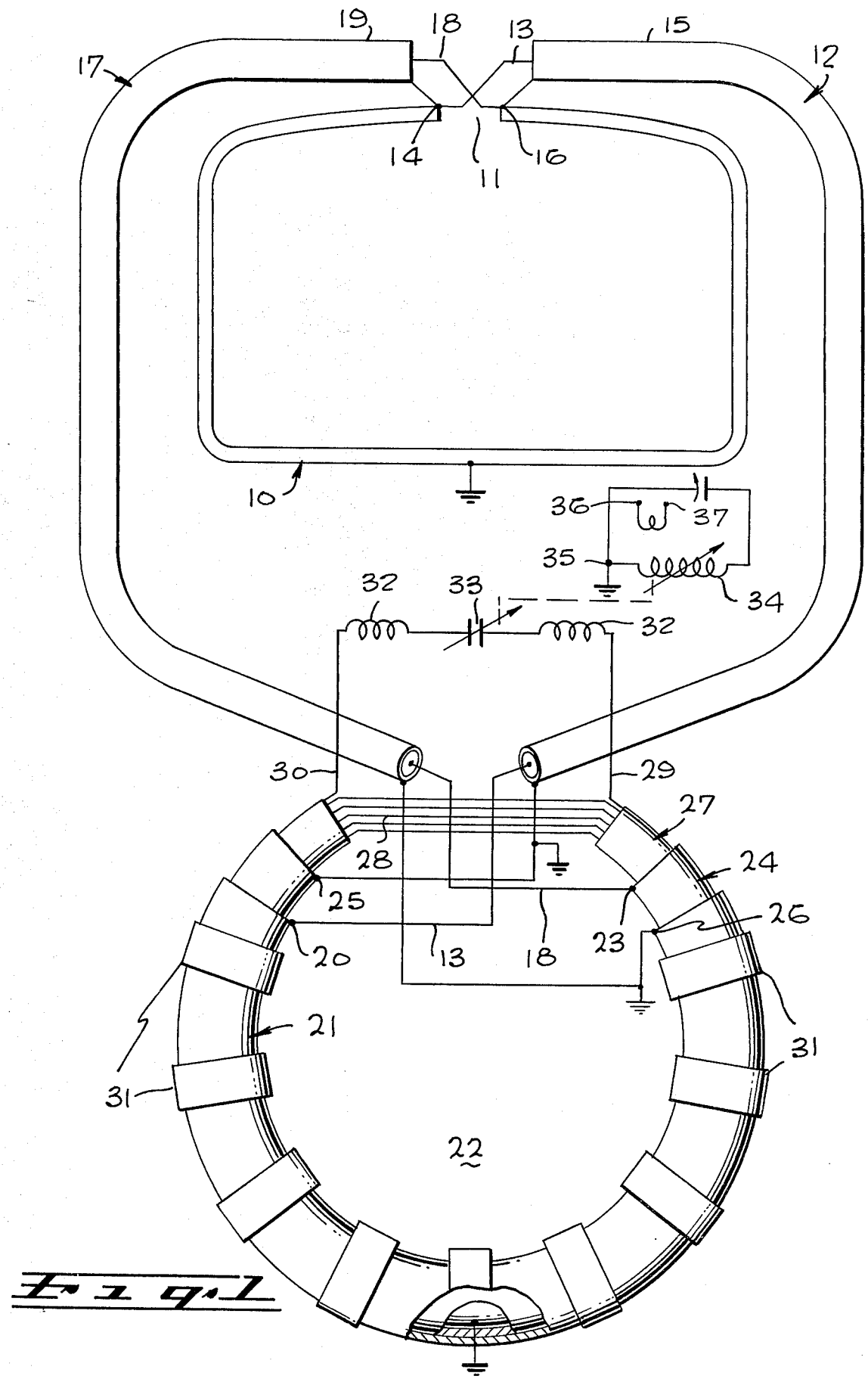
FIG. 1 is a partially schematic diagram, partially cut-away view of a conductive-body antenna system utilizing a radio-frequency transformer according to the present invention.

In FIG. 1 conductive body 10 has discontinuity 11 therein across which a potential difference develops when body 10 is exposed to electromagnetic radiation. Coaxial cable 12 has its inner conductor 13 connected to pick-up point 14 on body 10. Cable 12 has its outer conductor 15 connected to pick-up point 16 on body 10. Coaxial cable 17 has its inner conductor 18 connected to pick-up point 16 and its outer conductor 19 connected to pick-up point 14. Thus, cables 12 and 17 are driven out-of-phase.

Inner conductor 13 of cable 12 is connected at its remote end to one end 20 of conductive hollow tube or sheath 21 which forms the first portion of the primary of the radio-frequency transformer 22 according to the present invention.

Center conductor 18 of cable 17 is connected at its remote end to end 23 of hollow, conductive sheath or tube 24 which constitutes the second portion of the primary of transformer 22, according to the present invention.

Outer conductor 15 of cable 12 is connected at its remote end to conductive sheath 24 at end 25, which is grounded. Outer conductor 19 of cable 17 is connected at its remote end to conductive sheath 21 at end 26, which is grounded.

Shielding sheath 27, which is conductive, separates primary sheaths 21 and 24, electrostatically, from secondary winding 28, which terminates in conductors 29 and 30.

Sheaths 21, 24 and 27 are made of a material which is electrically conductive and non-magnetic in nature. Normally copper is the material utilized in these sheaths or tubes.

Sheath 21 (and, consequently, sheath 24) may have beads 31 of high magnetic permeability ferrite material placed over it along its length. As a result, magnetic flux generated by the flow of radio frequency currents in sheaths 21 and 24 is concentrated within the transformer resulting in greater coupling between sheaths 21 and 24, and secondary 28. Additionally, the effective inductance of sheaths 21 and 24 is increased. Many ferrite materials with permeabilities of 2000 to 3000 and low losses at radio frequencies are available in the marketplace, as for example from Indiana General Corporation.

Sheaths 21, 24 and 27 are electrically insulated from each other within the transformer by spacing or otherwise. Of course, intentional external connections may be made to achieve certain desired circuit configurations. For example, if it is desired that the transformer be operated as an auto-transformer, the ungrounded end of sheath 21 or 24 may be connected to conductor 29 or conductor 30 of secondary 28.

By reason of the fashion in which primary sheaths 21 and 24 are driven by signals from discontinuity 11, the radio-frequency currents flowing in sheaths 21 and 24 produce in-phase magnetic flux in secondary 28. For example, if at any instant pick-up point 16 is considered positive, pick-up point 14 will be negative. This means that end 23 of sheath 24 will be positive and end 25 of sheath 24 will be at ground potential. Correspondingly, end 20 of sheath 21 will be at a negative potential with respect to end 26, which is at ground potential. Instantaneous current flow in sheath 24 will be from end 23 to end 25 whereas, simultaneously, in sheath 21 the instantaneous current flow will be from end 26 to end 20. It is clear that an aiding flux will be developed by the two primary portions and will cut the secondary winding 28.

Transformer secondary conductors 29 and 30 are shown connected across receiver antenna primary coil 32 in the center of which is antenna-system tuning condenser 33. Tuning condenser 33 is ganged with permeability tuner 34 in associated radio apparatus, one end, 35, of which is grounded. Output signals to translating circuits, e.g. transistorized amplifiers, are taken from terminals 36 and 37.

If an unbalanced coupling system is to be used condenser 33 may be grounded on one side and one of the half sections, 32, removed. The details of this coupling method are not a part of this invention, however.

Electrostatic shielding sheath 27 may be grounded at its center point, as shown, to minimize noise coupling between the primary and secondary of transformer 22.

One of the primary applications for the present invention is in antenna systems for automobiles. In such an environment size of the transformer and efficiency of its performance are of paramount importance. In deriving two signals from a single discontinuity and driving a coupling transformer in push-pull fashion, previous embodiments have had a center-tapped primary which occupied twice the space occupied by the transformer according to the present invention. Furthermore, because its length was twice the apparent length of the primary in the transformer according to the present invention the cost was significantly greater because the highest-cost components of transformers of this type are the ferrite beads which cover the primary. By the telescoping or nesting of the two primary portions according to the present invention the cost is reduced, push-pull driving of the primary is achieved, distributed capacitance is reduced (thus improving the L/C ratio and "Q" of the system) and electrostatic noise reduction is achieved. The further inclusion of a telescoping, grounded, electrostatic shielding sheath between the telescoped primary portions and the secondary results in a further reduction in distributed capacitance (since the capacitance between sheaths 21 and 24 is in series with the capacitance between sheath 24 and the grounded sheath 27) and further reduction in the electrostatic noise transfer between primary portions and the secondary of transformer 22.

While a specific embodiment has been described, modifications may be made within the scope of the invention. The following claims are intended to cover such embodiments.

What is claimed is:

1. A radio-frequency transformer system, including:
   a source of push-pull radio-frequency signals having first and second output terminals at respective ones of which radio-frequency signals of substantially equal amplitude but opposite phase appear;
   a transformer primary having first and second hollow tubular portions, said second portion being nested within but electrically insulated from said first portion; and,
   a secondary winding including multiple turns of an electrical conductor passing through the inner opening of said second portion of said primary;
   said first and second portions of said primary each having a first and a second end, said first end of said first portion being coupled to said first output terminal, said first end of said second portion being coupled to said second output terminal;
   said first end of said first portion being juxtaposed to said second end of said second portion and said first end of said second portion being juxtaposed to said second end of said first portion.

2. Apparatus according to claim 1 which includes, in addition, resonating means for resonating said secondary winding at a predetermined radio frequency.

3. Apparatus according to claim 2 in which said resonating means includes a variable condenser.

4. Apparatus according to claim 1 which includes, in addition, a third hollow tube of conductive material interposed between said second portion of said primary and said secondary winding, said third hollow tube being connected to ground potential substantially at its midpoint.

5. Apparatus according to claim 4 which includes, in addition, capacitive means for resonating said secondary winding.

6. Apparatus according to claim 5 which includes, in addition, ferrite beads surrounding said first portion of said primary.

7. Apparatus according to claim 1 in which said first and second portions of said primary have their ends substantially co-terminant.

* * * * *